United States Patent [19]

Fettweis

[11] Patent Number: 5,042,036
[45] Date of Patent: Aug. 20, 1991

[54] PROCESS FOR REALIZING THE VITERBI-ALGORITHM BY MEANS OF PARALLEL WORKING STRUCTURES

[75] Inventor: Gerhard P. Fettweis, Aachen, Fed. Rep. of Germany

[73] Assignee: Heinrich Meyr, Aachen, Fed. Rep. of Germany

[21] Appl. No.: 213,166

[22] Filed: Jun. 29, 1988

[30] Foreign Application Priority Data

Jul. 2, 1987 [DE] Fed. Rep. of Germany ....... 3721884

[51] Int. Cl.$^5$ ............................................. G06F 11/10
[52] U.S. Cl. ..................................................... 371/43
[58] Field of Search ............... 371/43, 44, 45; 375/51, 375/34, 58

[56] References Cited

U.S. PATENT DOCUMENTS

| | | | |
|---|---|---|---|
| 3,891,959 | 6/1975 | Tsuji et al. | 371/43 |
| 4,583,078 | 4/1986 | Shenoy et al. | 371/43 |
| 4,606,027 | 8/1986 | Otani | 371/43 |
| 4,757,506 | 7/1988 | Heichler | 371/43 |
| 4,847,871 | 7/1989 | Matsushita et al. | 371/43 |

Primary Examiner—Charles E. Atkinson
Attorney, Agent, or Firm—Collard, Roe & Galgano

[57] ABSTRACT

A method for implementing the Viterbi algorithm (Viterbi decoder) for very high data rates/decoding rates. The trellis diagram (original trellis diagram) of the Markov process, the original trellis diagram being the basis of such implementation, is considered over a greater period. Transitions of the original trellis diagram are combined in one multi-step transition (multi-step trellis diagram) per each M. The number of transition branches, which rise exponentially, in such a process with M, is reduced to a smaller number by exploiting fundamental properties of the original trellis diagram forming the basis of the multi-step transitions. This eliminates non-optimal transition branches irrespective of the change from one multi-step transition to another. This permits the design of Viterbi decoders for very high data rates, as more time is available for executing the computing operations on number of computers as compared to the maximum permissible time for executing similar (identical) operations in the implementation of the Viterbi algorithm based on the one-step transition of the original trellis diagram.

17 Claims, 12 Drawing Sheets

FIG. 1a
Definition of Symbols Used in The Figures

Schematic View of a Transition (1-Step Transition) of The Original Trellis Diagram.

ACS–Unit Consisting of Maximally $N_z$ Parallel ACS–Cells.

Complete Set of State Metrics $\lambda$ of The n-th Transition of The Original Trellis Diagram.

Intermediate Memory in Signal Path (Route)

State Metrics (Input)
State Metric (Output) } In FIG. 6 & 8

Schematic View of The Routes Selected (Detected) Across M. Steps. F And B Characterize The Number of Steps in Which Several Alternatives May (Still) Appear. FIG. 10

Schematic View of The Routes Selected (Detected) Across M. Steps. F And B Characterize The Number of Steps in Which Several Alternatives May (Still) Appear. FIG. 11

$N_z =$ The Number of States of The Markov Process on Which The Method Is Based, And Thus of The Trellis Diagram, With The States Themselves Being Denoted By $Z_1$, $Z_2$ to $Z_{N_z}$ $\lambda =$ Transition Metric

FIG. 1b

Multi-Step Trellis Diagram

Original Trellis Diagram With M Transitions

▯, │ Complete Quantity of $N_z$ States

FIG. 1c

Simple Example For M=3

Original Trellis Diagram

Multi-Step Trellis Diagram

PROCESS FOR REALIZING THE VITERBI-ALGORITHM BY MEANS OF PARALLEL WORKING STRUCTURES

BACKGOUND OF THE INVENTION

1. The Field of the Invention

This invention relates to a method for carying out or implementing the Viterbi algorithm with the help of parallelprocessing structures.

2. Description of the Prior Art

The method is based on a Markov process with a finite numbers of states, which process is completely described by a state transition diagram (i.e., a trellis diagram) that is represented by its sequence of transitions. One transition branch of the trellis diagram describes the possibility of the process of changing from the originating state of the branch to its final state. The quantity of all transition branches that are disposed parallel in time is referred to as "transition." The process runs a route through the trellis diagram and an observer estimates this route by means of the Viterbi algorithm.

The Viterbi algorithm is an algorithm for estimating the optimal route which the Markov process has run through the trellis diagram. The trade journal, *Proceedings of the IEEE*, volume 61, March 1973, describes on pages 268 to 278 the Viterbi algorithm that has an abundance of different application possibilities. Implementation of the Viterbi algorithm, which is called the Viterbi decoder, exists as software on data processing units (including, for example, signal processors) and as circuits especially structured for its implementation. This is available from either commercially available components or special integrated circuits.

The maximum achievable data rate is always limited by the components/processors used (semiconductor technology), for which reason the methods or processes considered or implemented to date for high data rates/decoding rates make use of a Viterbi decoder that is based on the original trellis diagram. Such a Viterbi decoder has a separate processor for each state and is constructed with the help of the fastest semiconductor technology (ECL) (e.g., (i) J. S. Snyder: *High Speed Viterbi Decoding of High Rate Codes*, Phoenix, USA, 1983, Conf. Rec. pp XII16–XII23; (ii) T. Fujino, Y. Moritani, M. Miyake, K. Murakami, Y. Sakato and H. Shiino, *A 120 MBit/s 8PSK Modem with soft-decision Viterbi Decoder*, International Conference on Digital Satellite Communications 1986, Conf. Rec. pp 315–321).

Increasing the required data rate beyond this limitation, depending on the technology used, can be basically achieved only by suitable parallel processing. However, the Viterbi algorithm contains as an important component a non-linear recursion that can be reproduced on parallel-processing structures only in conformity with the number of states of the Markov process on which it is based. Any additional increase of the processing speed of a Viterbi decoder beyond such paralleling requires, for example, not using the original trellis diagram as the basis for the Viterbi algorithm/decoder, but rather a multi-step trellis diagram. Thus, the state transitions each are considered over a greater period of M transitions. The trellis diagram so produced, which is to be used as the new basis, is referred to as the multi-step trellis diagram.

In this way, a number of M transitions of the original trellis diagram are decoded per recursion. However, as the number of transition branches to be considered grows, the computing requirement of the Viterbi algorithm supplying the multi-step trellis diagram base also grows, with the growth being exponential with M. No processes have been proposed heretofore which reduce such computing requirement or such exponential dependence.

SUMMARY OF THE INVENTION

It is an object of the invention to provide a method or methods for implementing and executing any desired processing speed by suitably paralleling the Viterbi algorithm.

It is yet an additional object of the invention to provide circuits and architectures for carrying out the method for producing any desired processing speed by suitably paralleling the Viterbi algorithm.

It is yet a further object to provide a method by which the implementation expenditure for carrying out the Viterbi algorithm does not grow exponentially but rather with less than exponential dependence (for example, linear dependence) at the required data/decoding rate.

Accordingly, these objects are achieved by considering the trellis diagram of the process to be decoded, such process being the basis, over a greater period $M > 1$ by combining per each M the transitions of the original trellis diagram to a multi-step transition (multi-step trellis diagram). Fundamental properties of the original trellis diagram are exploited in order to reduce the number of computing operations, which number is asymptotically exponentially growing with M due to the introduction of the multi-step trellis diagram to a smaller dependence or amount. This is accomplished by allocating or distributing the execution of the computing operations to a number of computers. This is done in such a way that with the predetermined data rate/decoding rate, the computers will have more time available for carrying out the computing operations than the maximum permissible time for carrying out similar (identical) calculating operations in the conventional implementation of the Viterbi algorithm. Advantageous embodiments and circuits that can be used with such designs are also set forth.

The benefits achieved with the invention lie in the fact that possible solutions are proposed for implementing and carrying out the Viterbi algorithm by which solutions it is possible to basically achieve any desired data rate/decoding rate. The special feature and novelty of the proposed method is that the method is connected with an implementation expenditure with less than exponential dependence (linear dependence in the limiting case) on the desired rate.

It is generally pointed out that the term ACS-unit describes the computer carrying out the "add-compare-select" operation of the Viterbi algorithm for one total transition. The maximal parallelization of this unit lies in the fact that one processor/computer (=ACS-cell) is implemented for each state. The term "total ACS-unit" denotes the circuit arrangement of all ACS-units implemented in the Viterbi decoder.

These and other objects and advantages of the present invention will become apparent from the following description of the accompanying drawings, which disclose several embodiments of the present invention. It is to be understood that the drawings are to be used for the purpose of illustration only, and not as a definition of the invention.

BRIEF DESCRIPTION OF THE DRAWINGS

In the drawings, wherein similar reference symbols denote similar elements throughout the several views.

DESCRIPTION OF THE PREFERRED EMBODIMENT

Figure 1A:
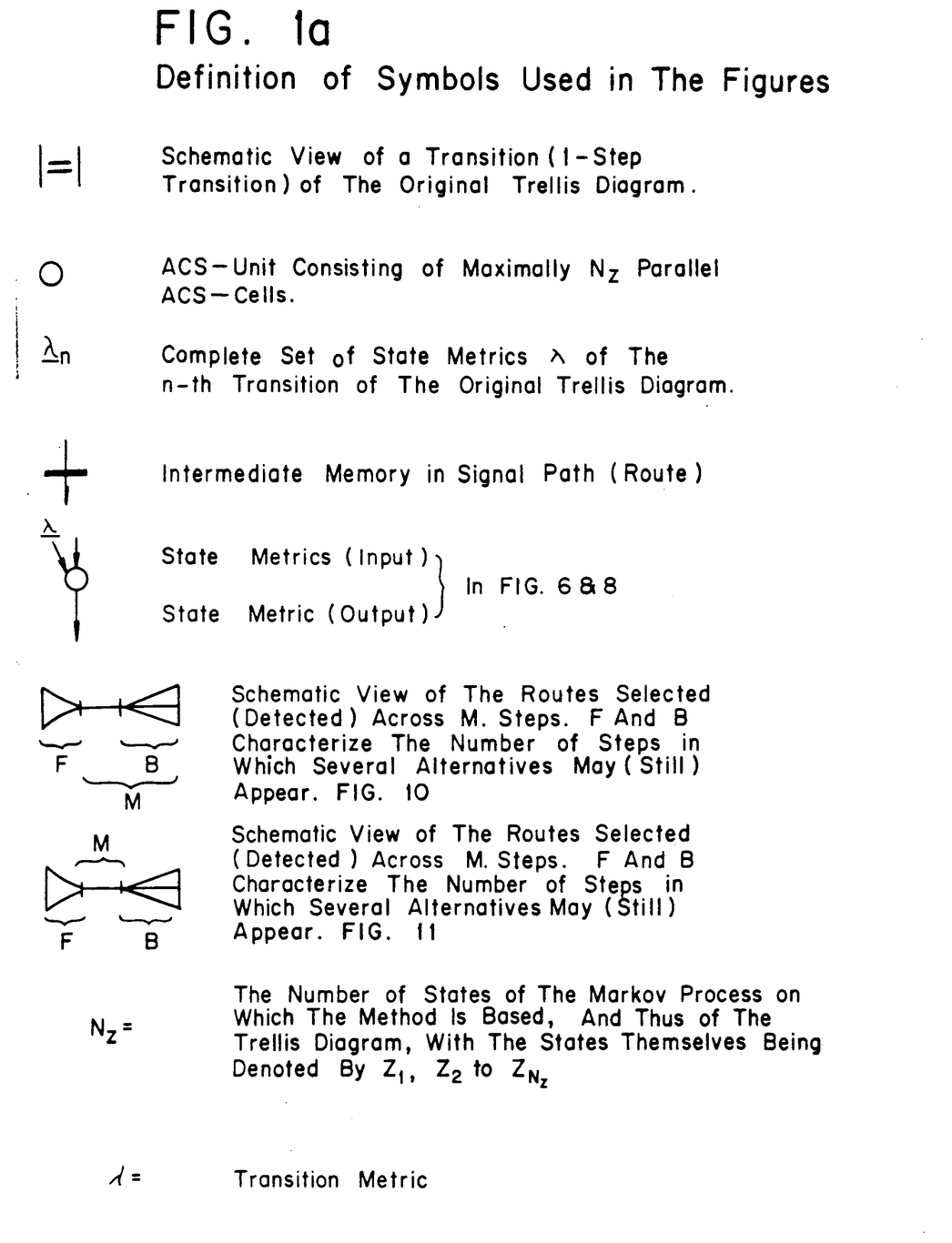
FIG. 1a gives the definitions of the symbols used in the figures.

Referring to the figures, the symbols used are described more fully, in FIG. 1a.

Figure 1B:
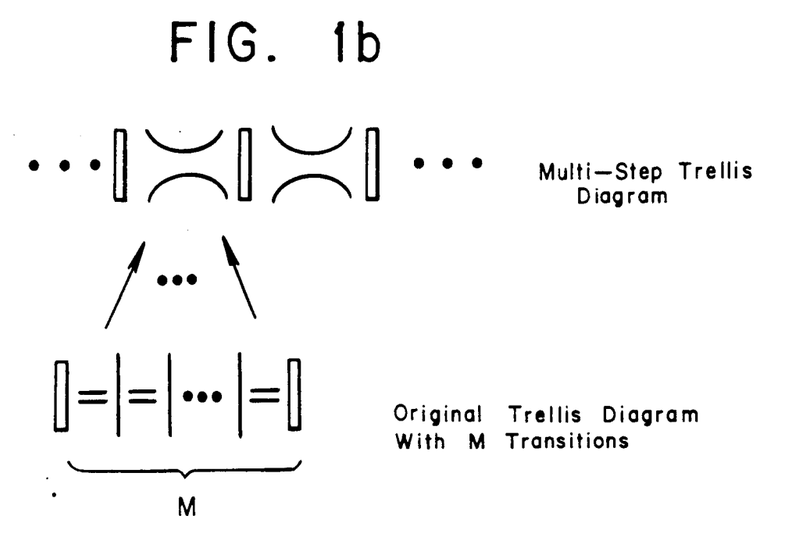
FIG. 1b is a general schematic view of the principle of introducing a multi-step trellis diagram.
Figure 1C:
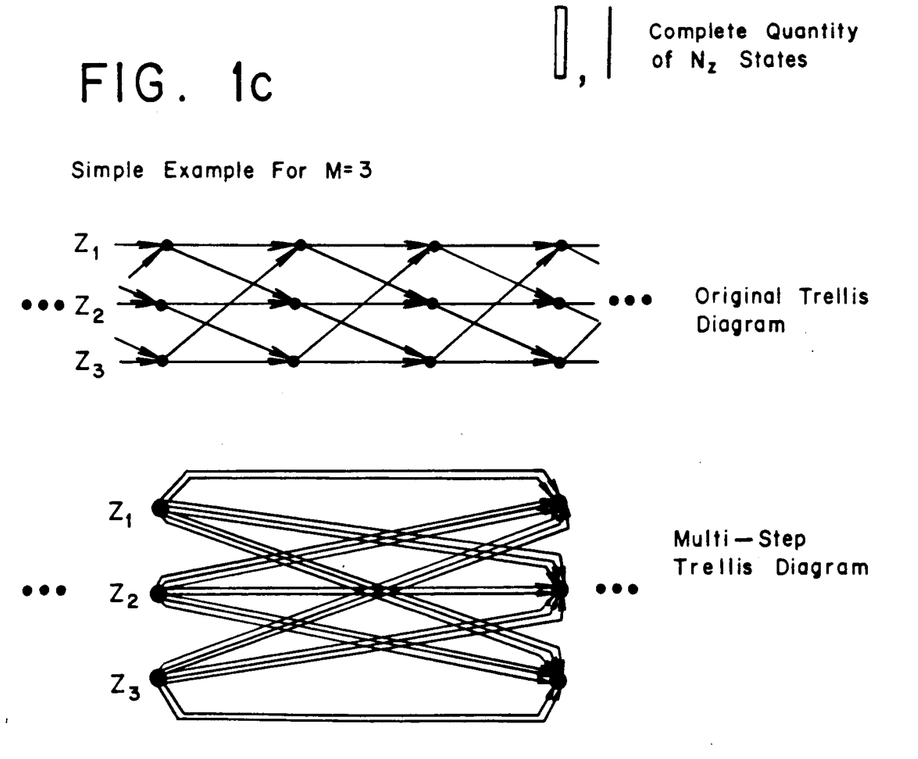
FIG. 1c is an example for $N_Z=3$ and $M=3$.
Figure 2:
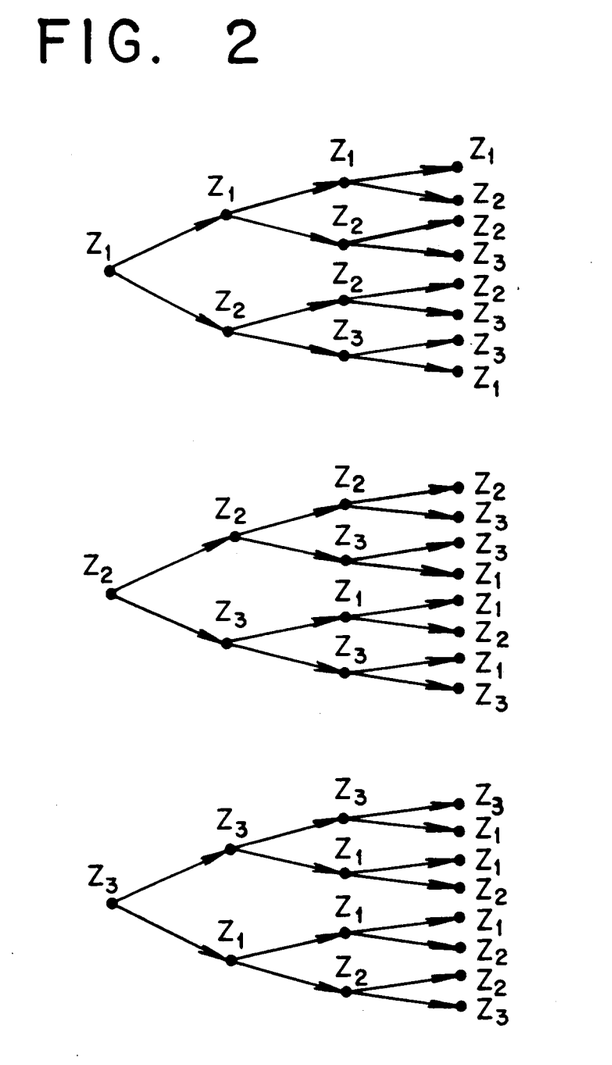
FIG. 2 shows, for the example of FIG. 1b, the design structure of the multi-step transition branches which start from the same state if they are assembled or made up from the M transitions of the original trellis diagram.
Figure 3:
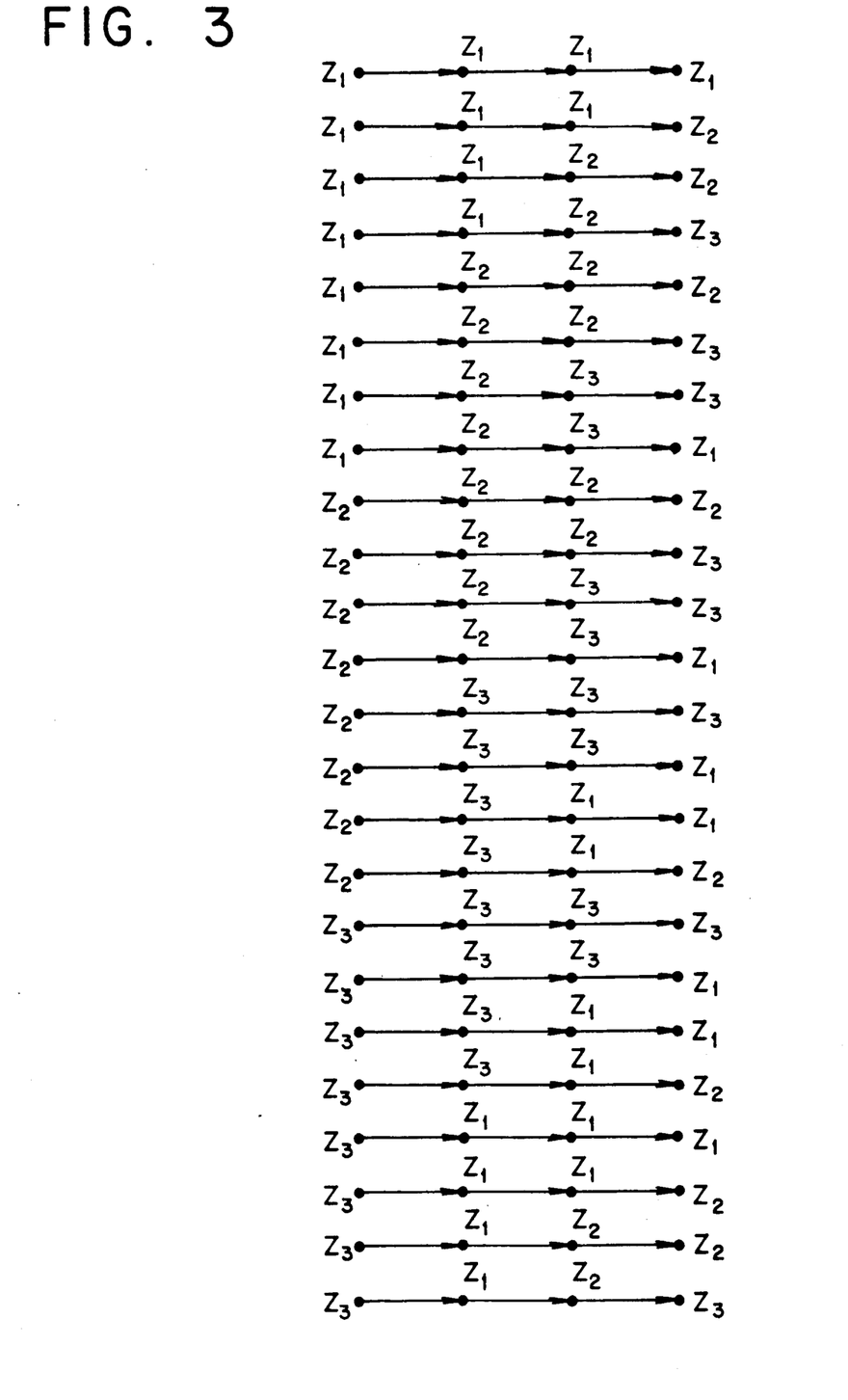
FIG. 3 shows, for the example of FIG. 1b, the principle of combining the transition branches of the multi-step trellis diagram from their original transition branches of the original trellis diagram.

Referring to FIG. 1b, there is shown the basic method of introducing a multi-step trellis diagram for $M=3$, by way of example. The exponential growth of the number of transition branches as a function of M is illustrated (for the example from FIG. 1b with $3\times 2^M$) by the tree structure shown in FIG. 2. With the example shown, the number of transition branches doubles with each increase of M by one. By returning the transition branches of a multi-step transition to its transition branches of the original trellis diagram (for the example shown in FIG. 3), a large number of possibilities are obtained for combining these multi-step transition branches in trellis diagrams. An example of such a combination of these transition branches in trellis diagrams is shown in FIG. 4 for the example in FIG. 1c.

Now, this procedure permits the use or application of the Viterbi algorithm, in each case based on the trellis diagrams so produced, which diagrams are limited with respect to their number of transitions. In this way, non-optimal, parallel transition branches of the multi-step trellis diagram are eliminated (in the present case, parallel means that the transition branches start at the same point in time from the same initial state, and end at the same point in time in the same final state).

Figure 4:
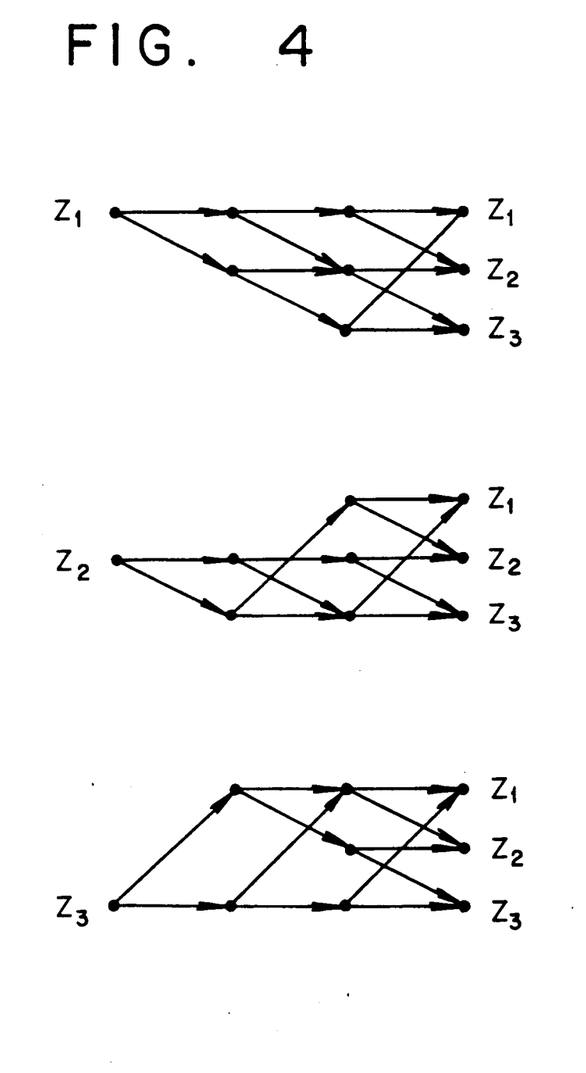
FIG. 4 shows for the combined transition branches from FIG. 3 (of the example of FIG. 1b) an example of equivalent trellis diagrams.

This method can be explained in a particularly simple and illustrative way if the trellis diagrams are produced in such a way that all transition branches of the multi-step trellis diagram starting from the same state are in each case combined to exactly one trellis diagram (as is shown in FIG. 4 for the aforementioned simple example). By using the Viterbi algorithm on the basis of these trellis diagrams, exactly the sole optimal transition branch is determined from each quantity of parallel branches of the multi-step trellis diagram. This permits a particularly simple decoding of the multi-step trellis diagram, for example, with the help of the Viterbi algorithm, which then does not have to take into account any parallel transition branches.

The additional calculating expenditure of this method as compared to a conventional implementation using the one- or single-step transition (original trellis diagram all the way through) is connected with the factor $N_Z$, which is the number of states. This is the minimum number ($N_Z$) of trellis diagrams required in order to permit the error-free decoding of a multi-step transition. In the method described here, any increase of the processing speed of a Viterbi decoder that is based on that method leads to a linear dependence of the implementation expenditure on the desired data rate. The reason for this is that all Viterbi algorithms carried out via trellis diagrams with a limited number of transitions can be computed independently of one another on separate Viterbi decoders. This has to be done solely in such a way that the Viterbi decoder of the multi-step trellis diagram receives the results of the other Viterbi decoders at the time such results are required.

Figure 5:
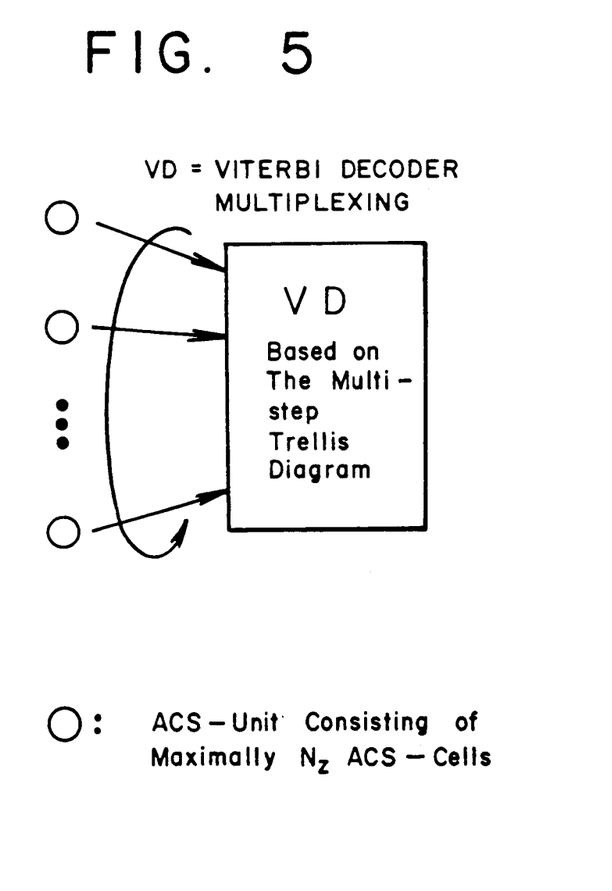
FIG. 5 shows the block circuit diagram of a circuit arrangement for realizing the total ACS-unit by the multiplex operation of L individual ACS-units, whereby VD denotes a Viterbi decoder.
Figure 6:
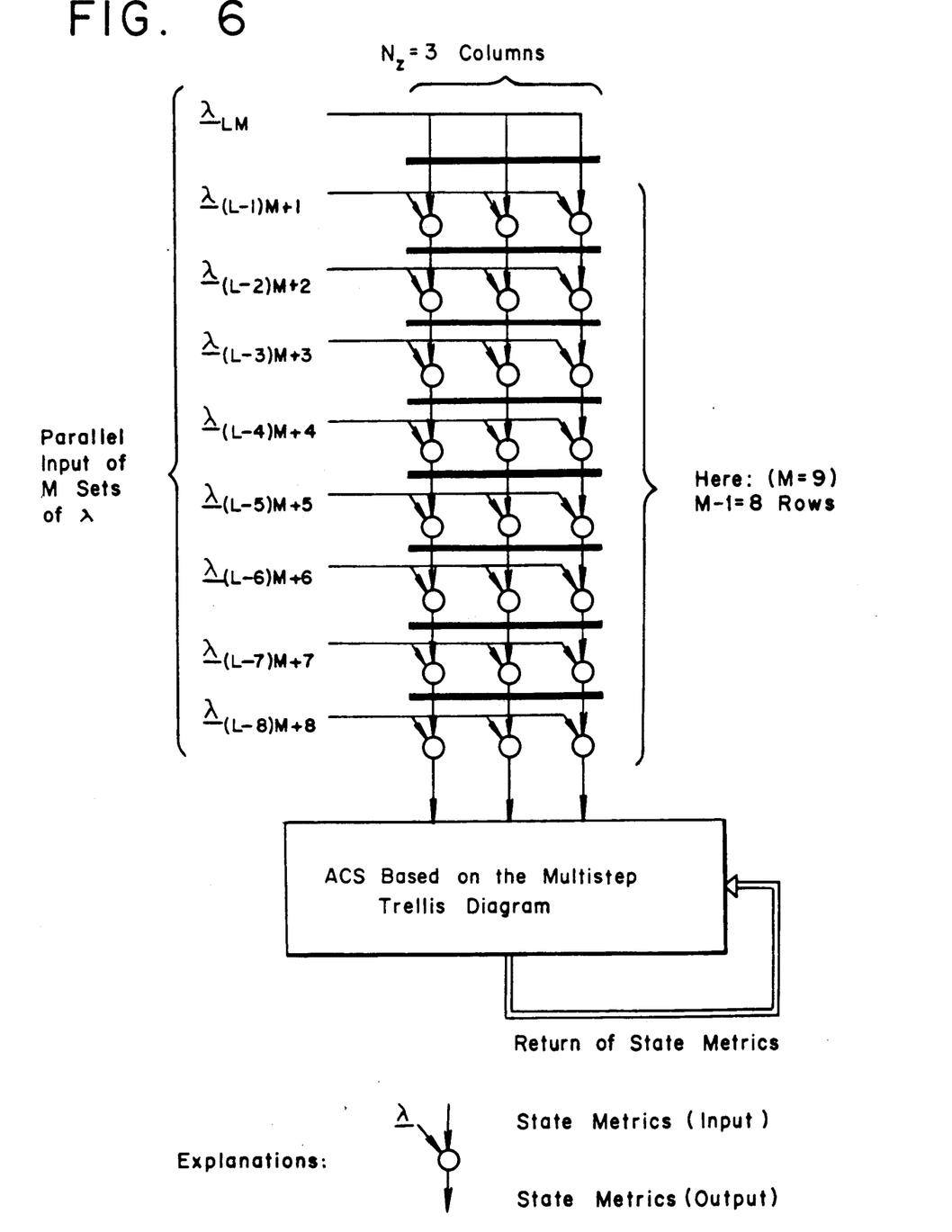
FIG. 6 shows the block circuit diagram of a circuit arrangement for realizing the total ACS-unit with a systolic structure shown by way of example for $N_Z=3$ and $M=9$ (multiplex operation of $L=24$ ACS-units plus one ACS-unit for the multi-step trellis diagram), whereby the working cycle of the circuit arrangement is to be reproduced by incrementing 1.

Referring to FIG. 5, there is shown an example of a circuit arrangement for realizing the total ACS-unit of the present method with the multiplex structure (ACS: add-compare-select = the arithmetic feedback unit which limits the processing rate of the Viterbi decoder), and FIG. 6 shows a corresponding systolic structure. Relatively simple implementation can be accomplished by the multiplex operation of several ACS-units as shown in the figures.

The circuit arrangement shown in FIG. 5 represents the principle for the implementation of a total of L ACS-units. All these ACS-units perform all of the ACS operations required for carrying out the Viterbi algorithm on the basis of the trellis diagrams, which are limited with respect to their number of transitions. The results of these ACS-units are supplied to the Viterbi decoder, which is based on the multi-step trellis diagram. Multiplexing of the results obtained from such units to the Viterbi decoder takes place in the form that the Viterbi decoder receives the results in the sequence in which it requires such results corresponding to the multi-step transitions.

The systolic circuit arrangement shown in FIG. 6 represents another form of multiplexing. Each ACS-unit shown in this figure in the field of $3 \times 8$ ACS-units performs only one ACS operation for a trellis diagram with a limited number of transitions. The execution of the Viterbi algorithm consequently progresses from the top downward through the rows. In FIG. 6, this corresponds with the incrementing of 1.

In the process explained above, an N number of trellis diagrams exists for each multi-step transition, which together describe a multi-step transition completely (N may be variable from one multi-step transition to another). The Viterbi algorithm is used for eliminating non-optimal routes within these trellis diagrams. Now, depending on the Markov process on which the method is based, the algorithm will, with high probability, lead to the fact that starting with an F number of transitions, the same routes are obtained (calculated) irrespective of which of the N trellis diagrams is used. It is therefore useful to completely carry out the Viterbi algorithm via only one of the N trellis diagrams and to carry out the Viterbi algorithm only via F transitions of the other $N-1$ trellis diagrams.

Figure 7:
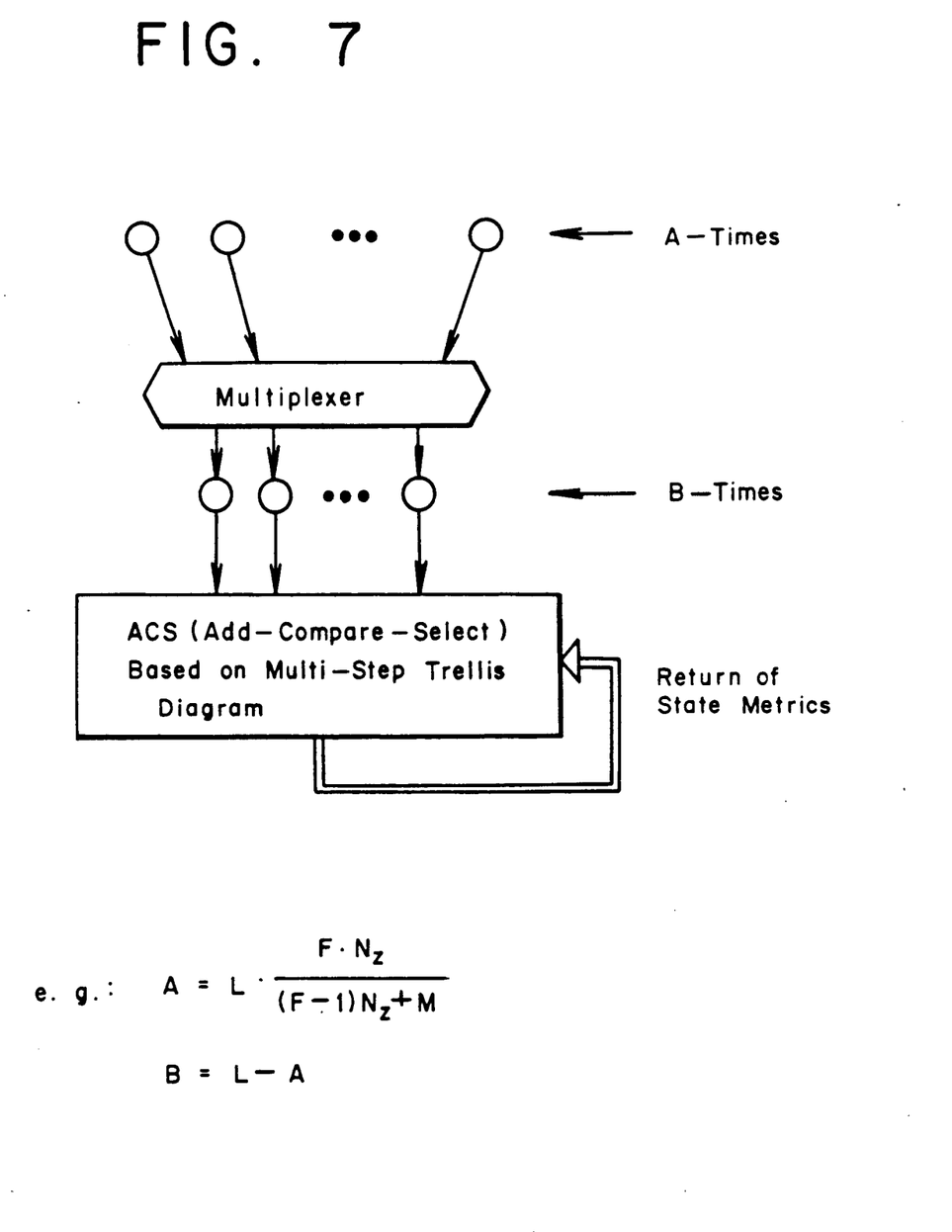
FIG. 7 shows the block circuit diagram for a circuit arrangement for realizing the total ACS-unit at the given $M>F$ by double multiplex operation of a total of L individual ACS-units plus one ACS-unit for the multi-step trellis diagram.
Figure 8:
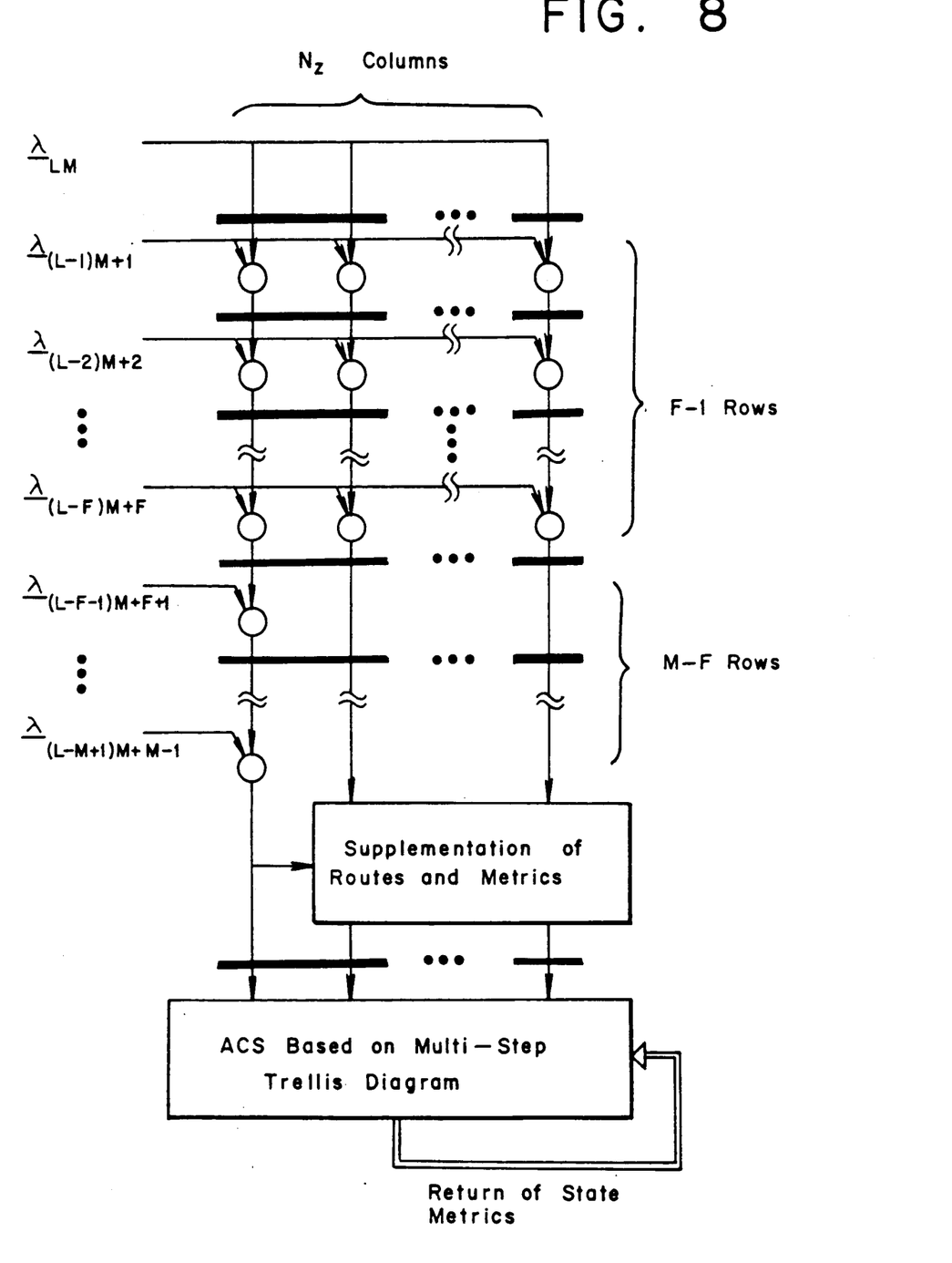
FIG. 8 shows the block circuit diagram for a circuit arrangement for realizing the total ACS-unit with a systolic structure at the given $M>F$ (multiplex operation of $L=(F-1)N_Z+M-1$ ACS-units, plus one ACS-unit for the multi-step trellis diagram) whereby the work cycle of the circuit arrangement is reproduced by incrementing 1.

The routes and metrics of the Viterbi algorithm discontinued after F transitions then will have to be supplemented in conformity with the routes and metrics of the one Viterbi algorithm that has been carried out completely. This may, under certain circumstances, substantially reduce the number of calculating operations that have to be carried out. An implementation of the total ACS-unit of this method can be advantageously executed with the multiplex structure shown in FIG. 7, or with the systolic structure shown in FIG. 8 (the explanations given above in connections with FIGS. 5 and 6 are applicable to the latter figures as well). This variation of the afore-described process permits calculating expenditure savings depending on the conditions, for example $(N_Z-1)(M-F)/M$, connected with the same implementation savings.

In a slightly different method, for each transition the multi-step trellis diagram is again based on the corresponding (complete) original trellis diagram. This limited original trellis diagram is expanded by an F number of transitions in such a way that a Viterbi algorithm that is based on the latter will use these F transitions in the beginning in order to complete its acquisition with the execution of the algorithm via the additional F transitions. The acquisition of the executed Viterbi algorithms means that after the Viterbi algorithm has been carried out via the additional F transitions, it is assured with a high probability that with further execution of the Viterbi algorithm via the following transitions, the optimal route among the routes so obtained will be the one that would have been determined by a Viterbi algorithm executed all the way through the entire trellis diagram. It should be noted here that the quantity F depends, of course, on the selection of the added trellis diagram, on the one hand, which diagram has to be formed from the additional F transitions, and on the initial occupation of the state metrics on the other hand.

Figure 9:
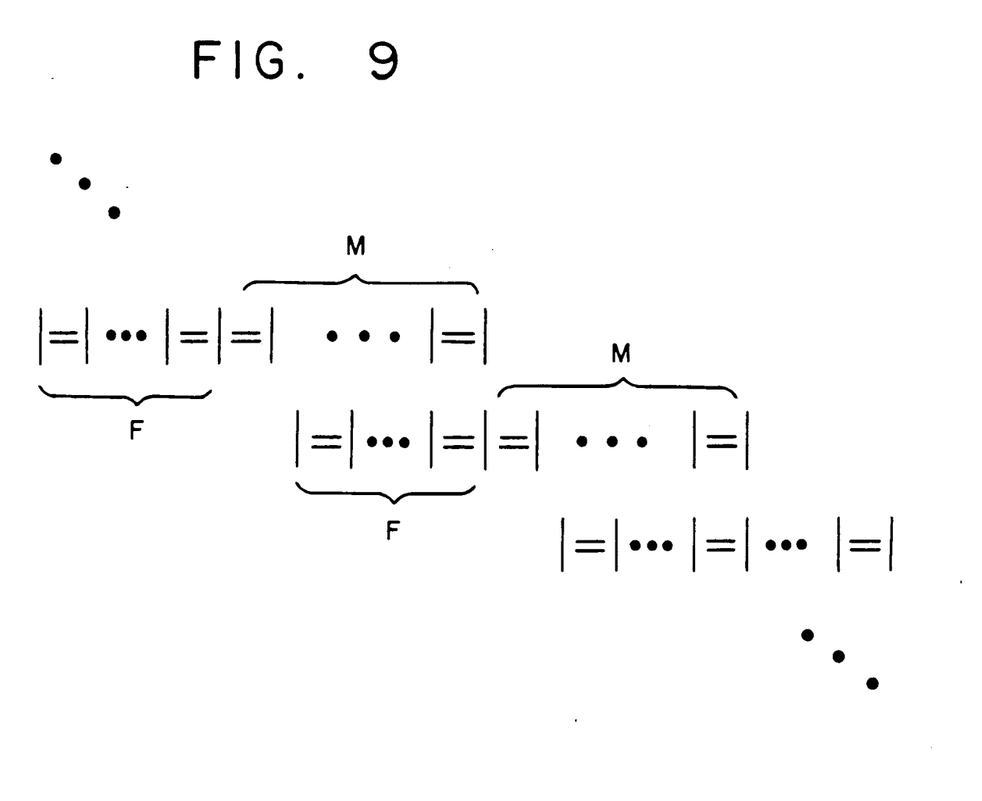
FIG. 9 shows the principle for the arrangement of trellis diagrams overlapping one another in each case by a measure conforming to F transitions of the original trellis diagram, whereby the same transitions (due to the overlapping) are arranged in the figure vertically one on top of the other.

In the present process, the neighboring limited trellis diagrams overlap one another, in each case by the F transitions (FIG. 9). In this way, the Viterbi algorithms that are based on these diagrams are executed correspondingly via $M+F$ transitions, whereby their acquisition has already been completed before they decode the M transitions. This assures with high probability that the decoded route will be decoded and a superior Viterbi algorithm (which is based on the multi-step trellis diagram and the Viterbi decoder required thereof) is almost completely omitted. The required decoder only consists of a route memory ("survivor memory") corresponding with the Viterbi algorithm.

The advantage of this method over the methods described earlier herein is that in the present case the additional calculation expenditure, as compared with an implementation using the conventional single-step transition (continuous original trellis diagram), is connected with the factor $(M+F)/M$, which is independent of $N_Z$ and negligibly low for large M's.

The last-discussed process becomes even more distinct for $M>B$, i.e., the required survivor length B is smaller than the number of transitions per multi-step transition. In this case, referring to FIG. 10, decoding can be accomplished only in dependence of the result of the executed Viterbi algorithm (or the associated Viterbi decoder) that is based on the neighboring trellis diagram, but free of feedback.

Figure 10:
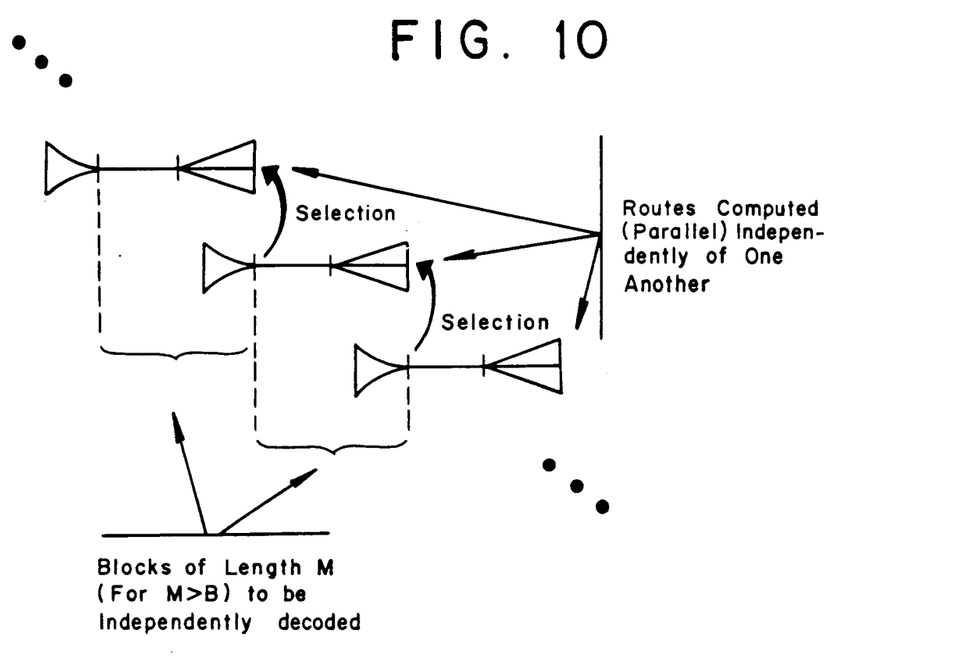
FIG. 10 shows the arrangement for routes conforming to FIG. 8, however, for $M>B$, with the principle of feedback-free decoding, whereby the same transitions (due to the overlapping) are arranged in the figure vertically one on top of the other.
Figure 11:
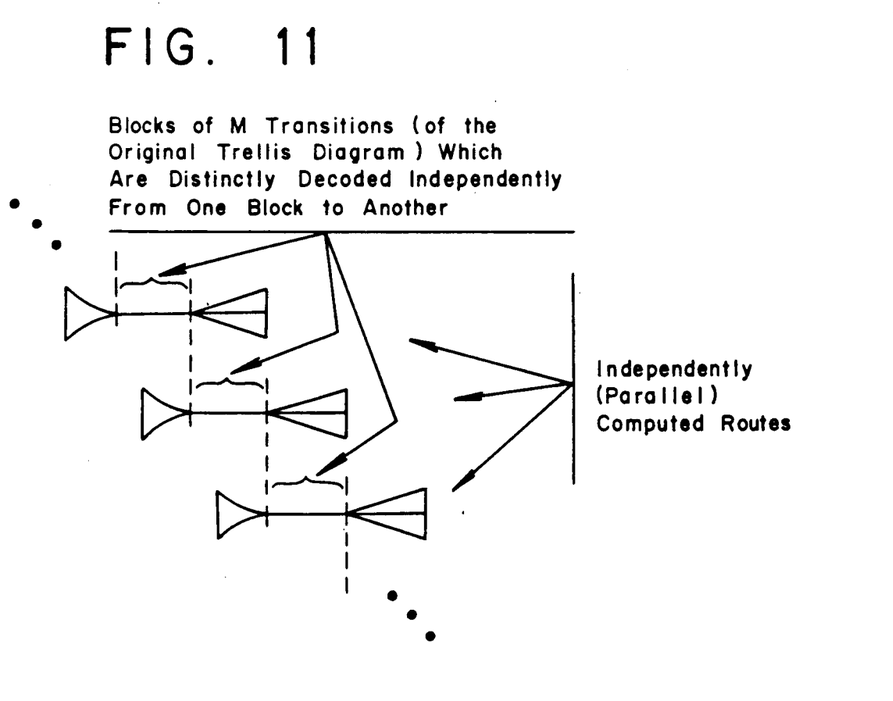
FIG. 11 shows the principle for the arrangement of the decoded routes, which overlap one another in each case by the measure conforming to $F+B$ transitions of the original trellis diagram whereby the same transitions (due to the overlapping) are arranged in the figure vertically one on top of the other.
Figure 12:
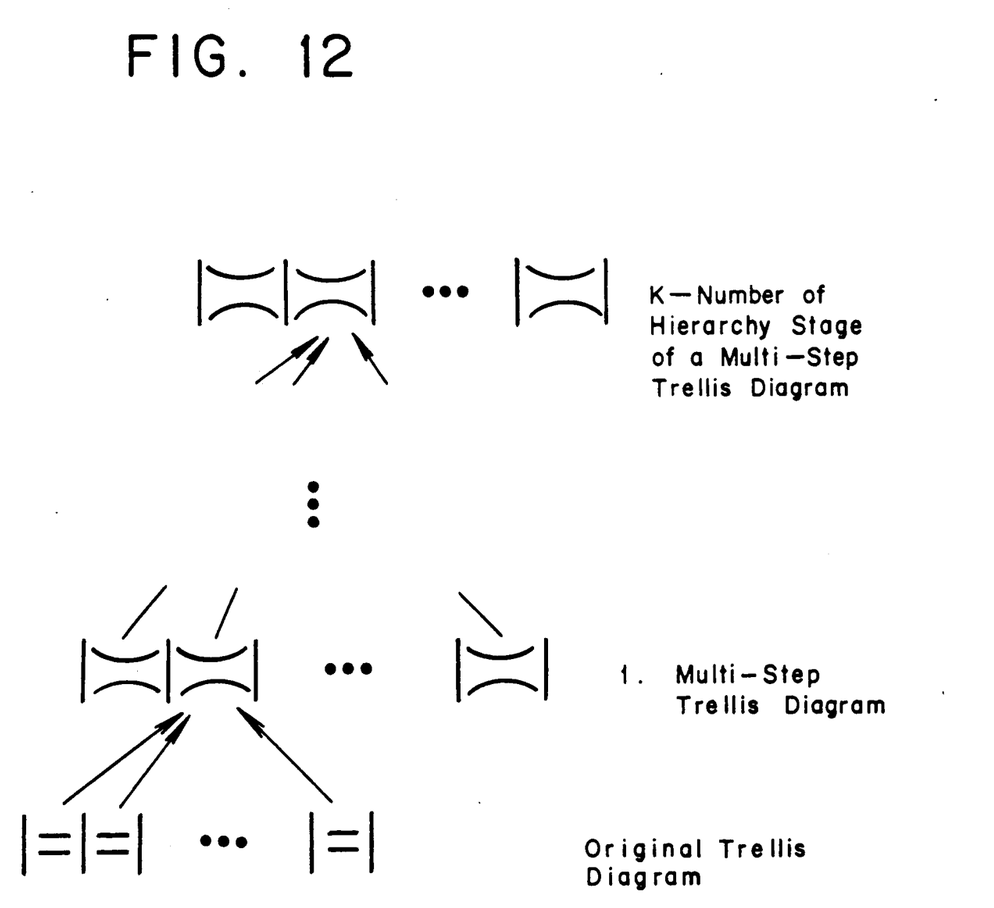
FIG. 12 is a general schematic view of the principle of the introduction of several hierarchy stages of trellis diagrams.

Another variation of this rpocess can be derived from the above-described method for $M>B$. Referring to FIG. 10, there is shown that in the above-described method for $M>B$, $M-B$ transitions have already been decoded distinctly per executed Viterbi algorithm. Accordingly, if a number of B transitions are added to each trellis diagram with a limited number of transitions in such a way that the executed Viterbi algorithm will use such B transitions in the end, distinctly decoded M transitions will exist per executed Viterbi algorithm (with high probability—see FIG. 11). This means that the M transitions, which jointly form a multi-step transition, are clearly decoded. In this way, the trellis diagrams to be used as the base will overlap one another not by F transitions but rather by $F+B$ transitions (of the original trellis diagram). The advantage of this method over the process described earlier, in which only additional F transitions are introduced, is that in the present method, implementation of the superior or higher survivor memory is completely omitted. This benefit is exchanged for a larger number of necessary calculating operations, increased by approximately the factor $(M+F+B)/(M+F)$ which becomes negligibly small for very large M's. This is particularly interesting in light of the fact that M can be selected irrespective of the desired data rate/decoding rate.

Finally, it is pointed out that each Viterbi algorithm executed based on a limited trellis diagram can, of course, use not only the sequence of transitions prescribed by the Markov process, but also an inversed sequence which conforms to an inversion (possibly only by sections) of the Markov process.

While several embodiments of the present invention have been described, and/or shown, it is obvious that many changes and modifications may be made thereunto without departing from the spirit and scope of the invention.

What is claimed is:

1. A method for implementing and carrying out the Viterbi algorithm with the help of parallel-processing structures, for any desired trellis diagram, comprising:
   combining blocks of $M > 1$ transitions of the original trellis diagram into multi-step transitions (leading to a multi-step trellis diagram);
   preprocessing each M-step transition separately using the Viterbi algorithm (based on the original trellis diagram) before decoding the M-step diagram, to reduce the number of computing operations, said number of computing operations rising asymptotically exponentially with M due to the introduction of the multi-step trellis diagram; and
   allocating the execution of the computing operations to a number of computers in such a way that at a predetermined data rate/decoding rate, the computers have more time available for the execution of the computing operations than the maximally permissible time for executing computing operations in the implementation of the Viterbi algorithm based on the one-step transition (original trellis diagram).

2. The method as set forth in claim 1, wherein the number (M) of transitions of the original trellis diagram combined in the multi-step transition in the multi-step trellis diagram is variable.

3. The method as set forth in claim 2, wherein the transition branches of the multi-step trellis diagram are again assembled from their original M transition branches of the multi-step trellis diagram are again assembled from their original M transition branches of the original trellis diagram and subsequently combined to trellis diagrams in a way such that the Viterbi algorithm is used for eliminating non-optimal transition branches in which case the Viterbi algorithm is executed only via a maximum limited number of $M_o = M$ recursions and that only the lower number of the selected transition branches is used for the decoding of the multi-step trellis diagram.

4. The method as set forth in claim 3, wherein for large M's and on the basis of all trellis diagrams jointly describing one multi-step transition, the Viterbi algorithm is executed only for one trellis diagram via all transitions of the trellis diagram, whereas for all other trellis diagrams, the Viterbi algorithm is executed only via F steps/transitions and the routes and metrices selected are supplemented according to the routes and metrices of the completely executed Viterbi algorithm.

5. The method as set forth in claim 4, wherein each Viterbi algorithm not completely executed is discontinued after $F_i$ transitions, where the numbers $F_i$ may differ from F.

6. The method as set forth in claim 3, wherein $M_o$ is less than or equal to M.

7. The method as set forth in claim 1, wherein the transition branches of the multi-step trellis diagram are again assembled from their original M transition branches of the original trellis diagram and subsequently combined to trellis diagrams in a way such that the Viterbi algorithm is used for eliminating non-optimal transition branches in which case the Viterbi algorithm is executed only via a maximum limited number of $M_o = M$ recursions and that only the lower number of the selected transition branches is used for the decoding of the multi-step trellis diagram.

8. The method as defined in claim 1, wherein the multi-step transition branches are combined in trellis diagrams in a way such that all transition branches of the multi-step trellis diagram starting from the same state are combined in exactly one trellis diagram.

9. The method as set forth in claim 8, wherein all trellis diagrams jointly describing one transition (multi-step) of the multi-step trellis diagram are formed in a way such that said trellis diagrams have the same number of transitions.

10. The method as set forth in claim 1, wherein any desired quantity of trellis diagrams with limited numbers of transitions are used as the basis for the Viterbi algorithm in the inverse direction (inverse Markov process) instead of their given direction (=sequence of the transitions).

11. The method as set forth in claim 1, wherein the method may be performed in any desired sequence.

12. The method as set forth in claim 1, wherein the basic method of introducing an additional hierarchy stage by means of the multi-step trellis diagram is applied to the multi-step trellis diagram itself.

13. The method of executing the Viterbi algorithm as set forth in claim 1 wherein each transition of the multi-step trellis diagram is based again on its original trellis diagram, the latter being limited across M steps/transitions and complete with respect to the transition branches, such a trellis diagram is expanded by additional F transitions in a way such that when using a Viterbi algorithm for decoding such trellis diagram, such additional F transitions are used in the beginning in order to assure with high probability that in the further execution of Viterbi algorithm on the M transitions (corresponding with the original trellis diagram) of the multi-step transition, the optimal route is obtained as one of the routes (as it would have been found by a continuously executed Viterbi algorithm), and further including the steps of:
   executing this Viterbi algorithm independently from one multi-step transition to another on a number of independent computers; and
   processing the routes so obtained, with the help of a superior computer in order to decode the optimal route conforming to the survivor memory of the Viterbi algorithm for decoding the multi-step trellis diagram, such routes extending via a limited number of transitions.

14. The method as set forth in claim 13, wherein at least one trellis diagram derivable from the original trellis diagram by the combining of transitions is used alternately with the original trellis diagram in any desired sequence.

15. The method as set forth in claim 13, wherein at least one trellis diagram derivable from the original trellis diagram by the combining of transitions is used instead of the original trellis diagram.

16. The method as set forth in claim 13, wherein M is larger than the required survivor length B ($M > B$); and no feedback exists across several multi-step transitions for decoding the multi-step trellis diagram.

17. The method as set forth in claim 16, wherein additional B transitions are added to each trellis diagram extending over a limited number of $F + M$ transitions (whereby B corresponds with the required survivor length) in a way such that said B transitions are processed by the executed Viterbi algorithm as the last transitions, the distinct route of the decoded transition of the multi-step trellis diagram (=M transitions of the original trellis diagram) is output independent of all other transitions of the multi-step trellis diagram, and no superior computer is required.

* * * * *